United States Patent

Zisa et al.

[11] Patent Number: 5,381,044
[45] Date of Patent: Jan. 10, 1995

[54] BOOTSTRAP CIRCUIT FOR DRIVING A POWER MOS TRANSISTOR

[75] Inventors: Michele Zisa, Comiso; Massimiliano Belluso, Catania; Mario Paparo, San Giovanni La Punta, all of Italy

[73] Assignees: Consorzio Per La Ricerca Sulla Microelettronica Nel Mezzogiorno, Catania; SGS-Thomson Microelectronics s.r.l, Milan, both of Italy

[21] Appl. No.: 918,440

[22] Filed: Jul. 22, 1992

[30] Foreign Application Priority Data

Jul. 24, 1991 [IT] Italy ............... MI91A002045

[51] Int. Cl.⁶ .................................... H03K 17/687
[52] U.S. Cl. ............................ 327/109; 327/108; 327/390; 327/589
[58] Field of Search ............ 307/270, 264, 578, 296.1, 307/296.2

[56] References Cited

U.S. PATENT DOCUMENTS

| | | | |
|---|---|---|---|
| 4,049,979 | 9/1977 | Shieu et al. | 307/270 |
| 4,398,100 | 8/1983 | Tobita et al. | 307/578 |
| 4,484,092 | 11/1984 | Campbell, Jr. | 307/270 |
| 4,542,307 | 9/1985 | Baba | 307/270 |
| 4,550,264 | 10/1985 | Takahaski et al. | 307/578 |
| 4,611,134 | 9/1986 | Ando | 307/270 |
| 4,633,106 | 12/1986 | Backes et al. | 307/578 |
| 4,644,190 | 2/1987 | Eberhard et al. | 307/578 |
| 4,680,488 | 7/1987 | Okumura et al. | 307/578 |
| 4,731,552 | 3/1988 | Miyamoto | 307/264 |
| 4,906,056 | 3/1990 | Taniguchi | 307/578 |
| 4,942,309 | 7/1990 | Chieli | 307/270 |
| 5,047,675 | 9/1991 | Cerato | 307/578 |

FOREIGN PATENT DOCUMENTS 0001323 1/1989 Japan .................. 307/578

Primary Examiner—Timothy P. Callahan
Assistant Examiner—T. T. Lam
Attorney, Agent, or Firm—Felsman, Bradley, Gunter & Dillon

[57] ABSTRACT

In accordance with the present invention, the above and other objects and advantages are obtained with a bootstrap circuit for a power MOS transistor in a high side configuration. Such circuit includes a first capacitor chargeable to a first voltage which is a function of the supply voltage of the power transistor. It further includes a second capacitor combined with the first capacitor so as to provide a second voltage which is higher than the first voltage and the threshold voltage of the power transistor.

7 Claims, 5 Drawing Sheets

5,381,044

BOOTSTRAP CIRCUIT FOR DRIVING A POWER MOS TRANSISTOR

BACKGROUND OF THE INVENTION

1. Field of the Invention

The present invention is concerned with a bootstrap circuit used for driving a power MOS transistor in a high side driver configuration.

2. Description of the Prior Art

One configuration for driving a power MOS transistor is the so-called "high side driver", in which the load is driven from the high side. Driving circuits can be implemented using discrete devices as well as integrated circuits. Operation of such driving circuits at high frequencies is limited by the threshold voltage of the power MOS transistor. As is known in the art, this threshold voltage is the minimum voltage which must be applied between the gate and the source of the power MOS transistor itself so that current can begin flowing between the drain and the source.

A widely used technology, for example, provides power MOS devices having a threshold voltage of about 3.5 volts. In order to obtain reliable operation of such a device as a switch, it is necessary to apply at least twice the threshold voltage between the gate and source. In the case of a device having threshold voltage of 3.5 volts, 7 volts is thus required for reliable operation.

Bootstrap circuits realized using conventional techniques allow a voltage equal to the supply voltage, less the losses introduced by the circuit itself, to be applied between the gate and the source of the power MOS transistor. It follows that, in order to achieve reliable operation of the power MOS transistor, the minimum value of the supply voltage to the bootstrap circuit must necessarily be higher than 7 volts.

Two classic circuit configurations are known in the art for driving a power MOS transistor: the bootstrap, which operates at a frequency equal to the switching frequency of the power MOS transistor; and the charge-pumping circuit, which operates at a frequency much higher than that of the power MOS transistor. Examples of these circuits are described in the article, "Drive Techniques for High Side N-Channel MOSFET's" Warren Schultz, Motorola Inc. SPS, *PCIM,* June 1987.

SUMMARY OF THE INVENTION

It is therefore an object of the present invention to provide a bootstrap circuit for driving a power MOS transistor in a high side configuration. It is a further object of the present invention to provide such a circuit which is capable of operating at low supply voltage levels when the power MOS transistor is to operate at high switching frequencies.

Therefore, in accordance with the present invention, the above and other objects and advantages are obtained with a bootstrap circuit for a power MOS transistor in a high side configuration. Such circuit includes a first capacitor chargeable to a first voltage which is a function of the supply voltage of the power transistor. It further includes a second capacitor combined with the first capacitor so as to provide a second voltage which is higher than the first voltage and the threshold voltage of the power transistor.

BRIEF DESCRIPTION OF THE DRAWINGS

The features of the present invention will be made more evident by embodiments thereof shown by way of non-limiting examples and enclosed drawings wherein.

DESCRIPTION OF THE PREFERRED EMBODIMENT

According to the present invention, a bootstrap circuit is provided in which efficiency is improved with respect to the conventional bootstrap circuit. This allows, in particular, the correct operation of the power MOS transistor at high frequencies, even at reduced levels of the supply voltage.

According to one embodiment of the present invention, a second capacitor is connected in parallel to a first capacitor, and charged in phase with the period of conduction of the power MOS transistor. The second, higher voltage made available to drive the power transistor is derived at the terminals of the second capacitor.

According to the second embodiment of the present invention the second capacitor is connected in series with the first capacitor, and charged in phase opposition with the conduction of the power MOS transistor. In this embodiment, the second, higher voltage is derived from the terminals of the series combination of capacitors, and is equal to the sum of the voltages across the first and second capacitors.

Figure 1:
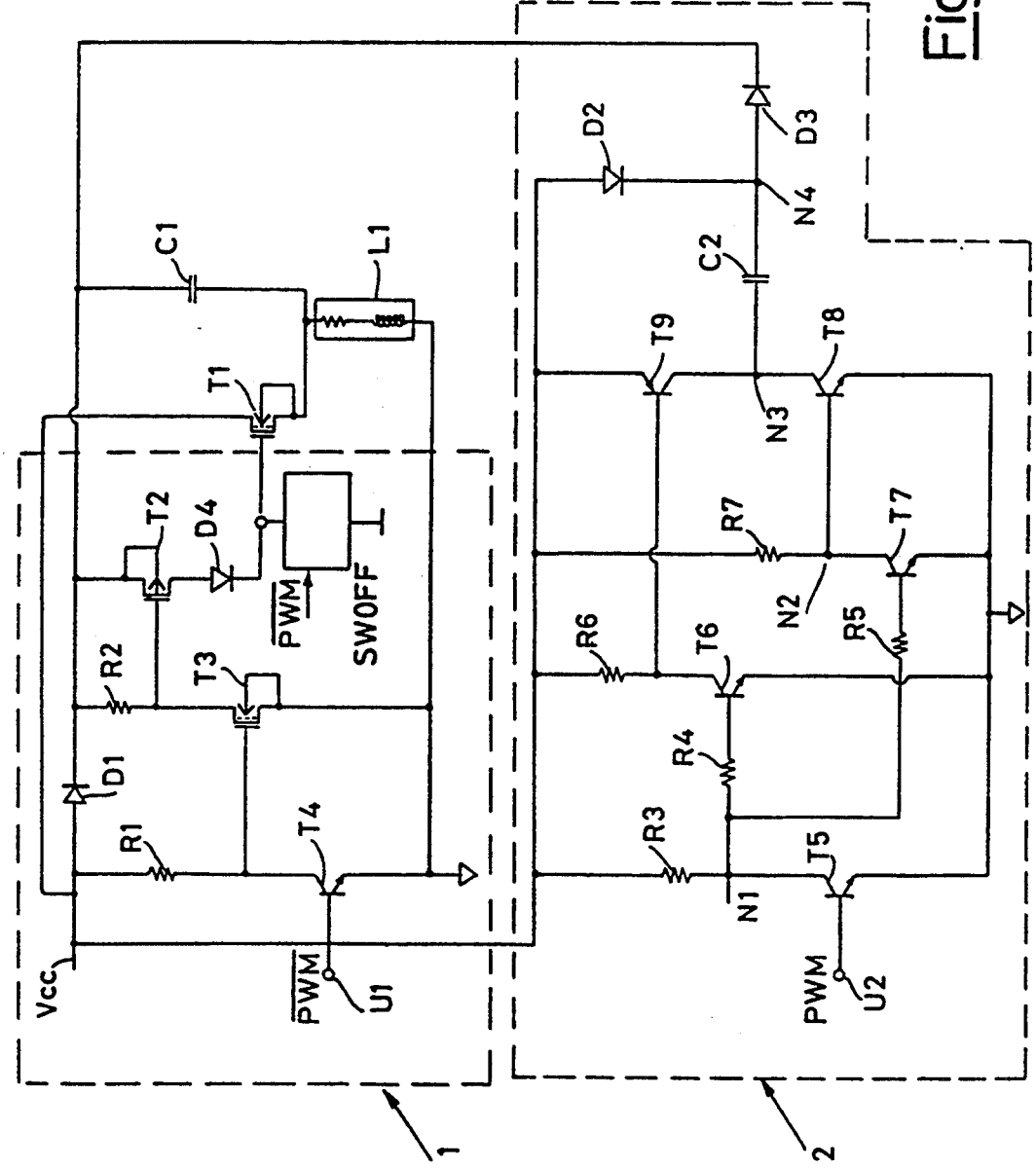
FIG. 1 shows a first embodiment of the circuit according to the invention.

Referring to FIG. 1, a first embodiment of a bootstrap circuit according to the present invention is shown. This circuit includes two blocks, represented by dashed lines and identified by the reference numbers 1 and 2.

Block 1 represents a conventional bootstrap circuit for a power, N-channel MOS transistor T1. It includes a bipolar NPN transistor T4 having a base connected to an inverted PWM signal input U1. The emitter of T4 is connected to ground, and the collector is connected to one side of a resistor R1 and to the gate of an N-channel MOS transistor T3. The other side of resistor R1 is connected to a supply voltage Vcc. The source of transistor T3 is grounded and the drain is connected to resistor R2. The drain of transistor T3 is also connected to the gate of P-channel MOS transistor T2. Resistor R2 is in turn connected to the supply Vcc through a diode D1 interposed between resistors R1 and R2.

The source of transistor T2 is connected through the diode D1 to the supply Vcc. The drain of transistor T2 is connected through a diode D4 to the gate of the power MOS transistor T1. A switchoff circuit SWOFF is also connected to the gate of power transistor T1. This gate connects the gate of power transistor T1 to ground when the inverted PWM signal rises to a high level.

Block 2 includes an NPN bipolar transistor T5 having its base connected to a PWM switch-on signal input U2.

The emitter of transistor T5 is connected to ground, and the collector is connected to the supply voltage Vcc through a resistor R3. A circuit node N1 is situated between a collector of transistor T5 and resistor R3. A resistor R4 is connected to circuit node N1 and to the base of NPN bipolar transistor T6. The emitter of transistor T6 is grounded while the collector is connected to the supply Vcc through a resistor R6. The collector of transistor T6 is also connected to the base of PNP bipolar transistor T9. The emitter of transistor T9 is connected to the supply Vcc, while the collector is connected to NPN transistor T8. The emitter of transistor T8 is grounded and the base is connected to an intermediate node M2 between a resistor R7 and the collector of an NPN bipolar transistor T7. The emitter of transistor T7 is grounded, while the base is connected to node N1 through a resistor R5.

Capacitor C2 is connected to an intermediate circuit node N3 between the collectors of transistors T8 and T9. The other side of capacitor C2 is connected at circuit node N4 to a diode D2, which in turn is connected to the supply Vcc. Capacitor C2 is also connected through a diode D3 to one side of the capacitor C1, and then through a diode D1 to the supply Vcc. Capacitor C1 is external to the bootstrap circuit. The other end of capacitor C1 is connected to the source of transistor T1 and, through a resistive/inductive load L1, to ground.

With reference to Block 1, the bootstrap is operated through an inverted PWM signal obtained from the PWM signal which operates the block 2. This signal is also complementary, in a logic sense, to the voltage value present on the load L1 of the power MOS transistor T1. Thus, when a high voltage value is present across the load L1, and the MOS power transistor T1 is in conduction, the inverted PWM signal at the point U1, has a low value.

When the inverted PWM signal present on the base of transistor T4 is low, transistor T4 is turned off. The gate of N-channel MOS transistor T3 is connected to the supply voltage Vcc through resistor R1, so that transistor T3 is turned on. This causes the gate of the P-channel MOS transistor T2 to go low. The MOS transistor T2 is then turned on, and in this condition it is capable of transferring the charge of the capacitor C1, through the transistor T2 to itself and the diode D4, to the gate of the power MOS transistor T1. This causes T1 to be turned on.

During this phase, the diode D1 is reverse biased. The supply voltage Vcc is present at the anode of diode At the cathode is a voltage which is the sum of the voltage Vcc—Vdson (Vdson=drain-source voltage when the transistor is conducting) present at the source of the power MOS transistor T1 at the instant of the turn on, and of the voltage Vcc present across the capacitor C1 and transferred to the gate of the power MOS transistor T1. Diode D1 operates to decouple the voltage present across the capacitor C1 from the supply voltage Vcc.

Referring to block 2, when the inverted PWM signal at the input of block 1 is low, the corresponding PWM signal at the input U2 of block 2 is high. Transistor T5 is turned on, and consequently, since the collector of the transistor T5 goes low, transistors T6 and T7 are turned off.

The signal at the collector of transistor T6 is high, so that the PNP transistor T9, whose base is driven by the collector of transistor T6, is turned off. At the same time, since transistor T7 is turned off, transistor T8 is turned on because its base is connected to the supply voltage Vcc through resistor R7. Under these conditions, capacitor C2 charges up to the voltage Vcc—Vbe(D2), when considering the saturation voltage of transistor T8 to be negligible.

Returning to block 1, when the inverted PWM signal at the input U1 switches from low to high, transistor T4 goes into conduction. This turns off transistor T3 directly, and transistor T2 indirectly through transistor T3. As a consequence the capacitor C1 is disconnected from the gate of the power MOS transistor T1. The gate of T1 is brought to ground by the switch-off circuit SWOFF.

At the same time, in the circuit of block 2, the corresponding PWM signal at the gate of transistor T5 switches from high to low. This turns off transistor while the transistors T6 and T7 are turned on because their bases are now connected to the supply voltage Vcc respectively through the series of the resistors R4+R3 and R5+R3. The signal at the collector of transistor T6 is low, so that transistor T9, whose base is driven by the collector of transistor T6, is turned on. At the same time, since transistor T7 is turned on, transistor T8 is turned off because its base is low.

Under these conditions, the terminal of the capacitor C2 connected to the collector of transistor T9 goes, apart from Vcsat(T9), to the supply voltage Vcc. The other terminal, which was already charged to the voltage Vcc—Vbe(D2), is charged to the voltage:

$$Vcc+Vcc-Vbe(D2)$$

Assuming, in this specific example, that C2 is a much larger capacitor than C1, the capacitor C1 then charges up through diode D3 to a voltage approximately equal to:

$$2Vcc-Vbe(D2)-Vbe(D3)$$

Thus, when the PWM and inverted PWM signals switch back to the high and, respectively, low level, capacitor C1 applies between the gate and source of the power MOS transistor T1 a voltage Vgs equal to:

$$2Vcc-Vbe(D2)-Vbe(D3)-Vbe(D4)$$

This voltage is capable of triggering the switchback of the power transistor even in the case of a low supply voltage Vcc.

In the case where the bootstrap circuit would have been composed only by the block 1, as occurs in prior art techniques, during the time interval in which the inverted PWM signal is high the capacitor C1 would have charged through the diode D1 to a voltage Vcc—Vbe(D1). During the switch-back of the inverted PWM signal from high to low, this charge would then have been transferred back to the gate of transistor T1. Transistor T1 would then have been turned on with a voltage Vgs equal to Vcc—Vbe(D1)—Vbe(D4). This would have resulted in a much lower voltage than the switch on voltage which results with the bootstrap circuit of the present invention. This lower, prior art voltage is not capable of providing for the switch-back of the power transistor in the event of a lower supply voltage Vcc.

In contrast, with the circuit of FIG. 1 and with C2 being much larger than C1, it is possible to obtain an increment of the voltage necessary to bring the transistor T1 into conduction. The efficiency of the circuit decreases with the ratio of the values of the capacitors C2/C1, as the voltage across C1 decreases with it.

A feature of this first embodiment of the bootstrap circuit is that capacitor C2 is charged in phase with the switch on of the power MOS transistor T1. Moreover, the diodes D2 and D3 serve to decouple the capacitor C2, respectively, from the supply voltage Vcc and from the capacitor C1 when the capacitor C1 transfers its charge to the gate of the power MOS transistor T1.

Figure 3:
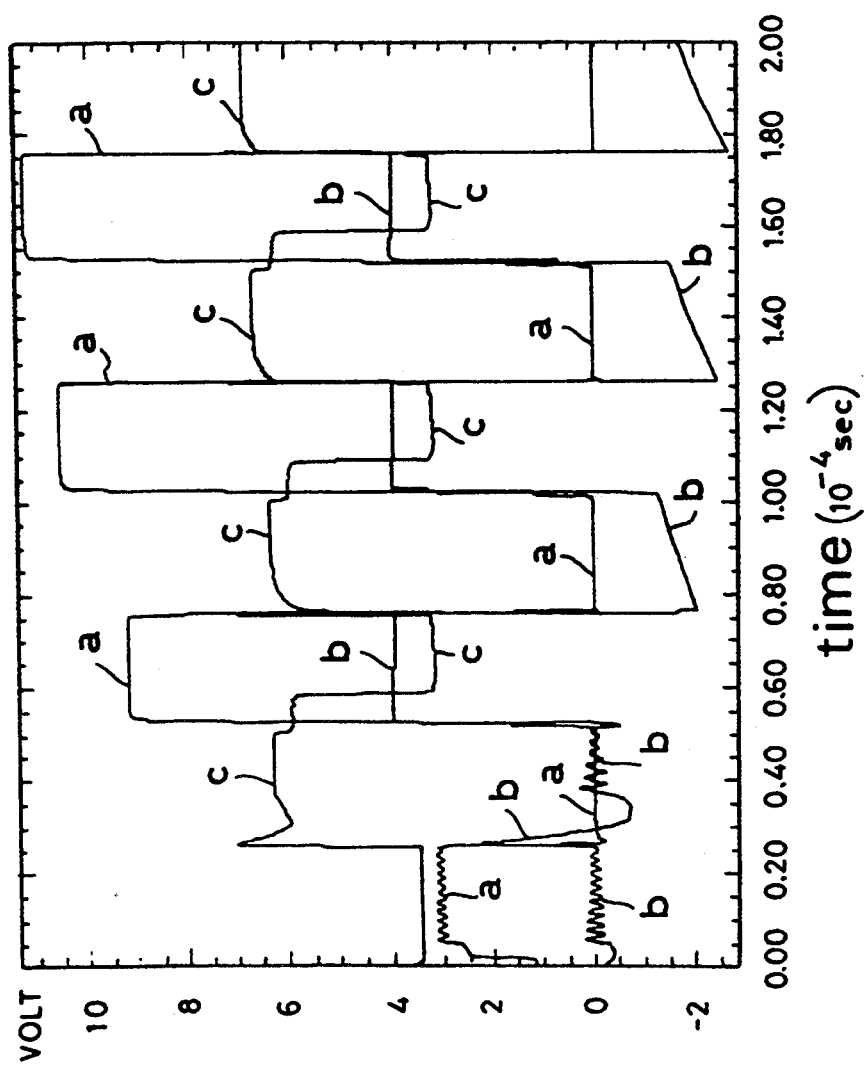
FIGS. 3 illustrates signal patterns on the gate and the source of the power MOS transistor, and across the second capacitor in the first embodiment of the bootstrap circuit according to the invention.
Figure 4:
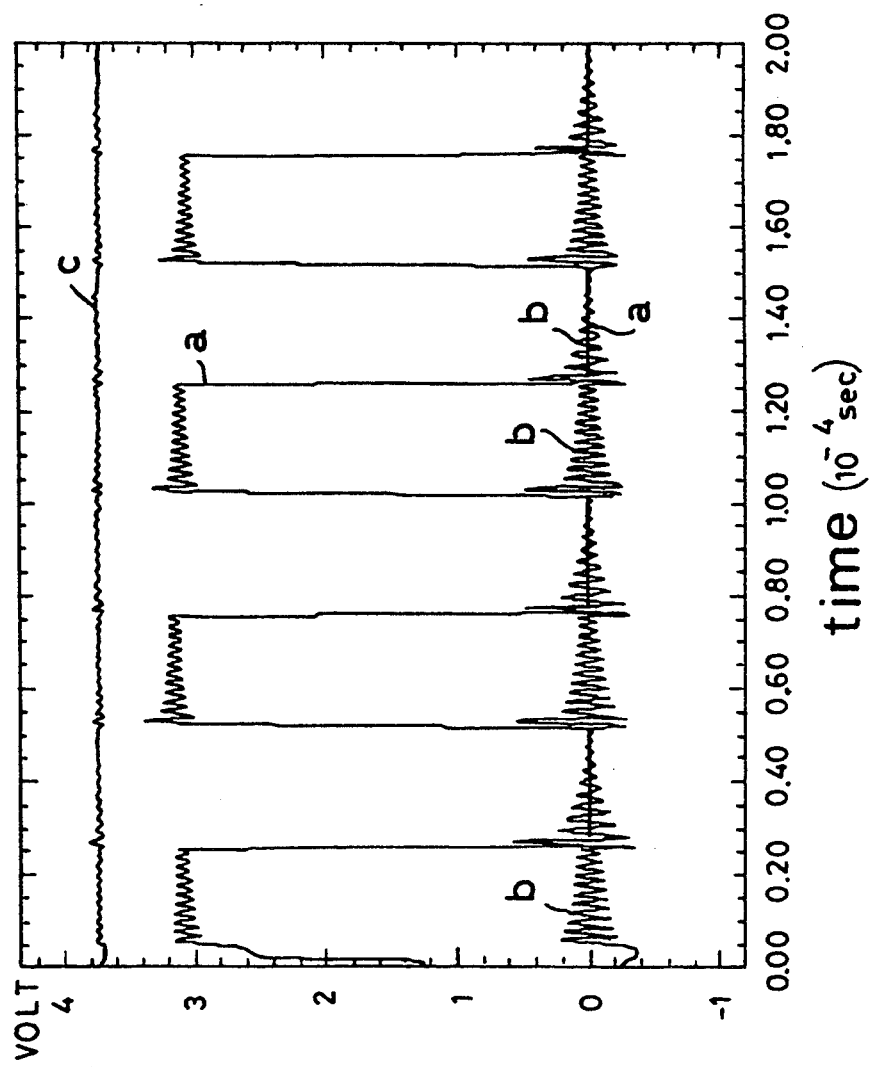
FIG. 4 illustrates the same patterns as FIG. 3 in a prior art bootstrap circuit.

FIGS. 3 and 4 illustrate the changes with time of various voltages in the circuit of FIG. 1. FIG. 3 illustrates operation of the circuit of FIG. 1, and FIG. 4 illustrates a conventional circuit as shown in block 1 of FIG. 1, without the addition of the circuitry of block 2. In both cases, Vcc is equal to 4 volts.

Within the figures, curve a represents the voltage at the gate of power MOS transistor T1. Curve b represents the voltage at the source of transistor T1. Curve c shows the voltage between the terminals of capacitor C2 at the circuit nodes N3, N4. FIG. 4, shows corresponding curves for a prior art circuit without block 2.

A comparison between FIGS. 3 and 4 illustrates the effect of including block 2 in the circuit of FIG. 1. The result is an increment of the gate-source voltage for the turn on of the power MOS transistor T1.

According to the first embodiment of the bootstrap circuit, capacitor C1 is charged with a capacitor C2 placed in parallel with it. As an alternative, second embodiment, the bootstrap circuit can be realized in such a manner as to charge the capacitor C1 and a capacitor C2 connected in series.

Figure 2:
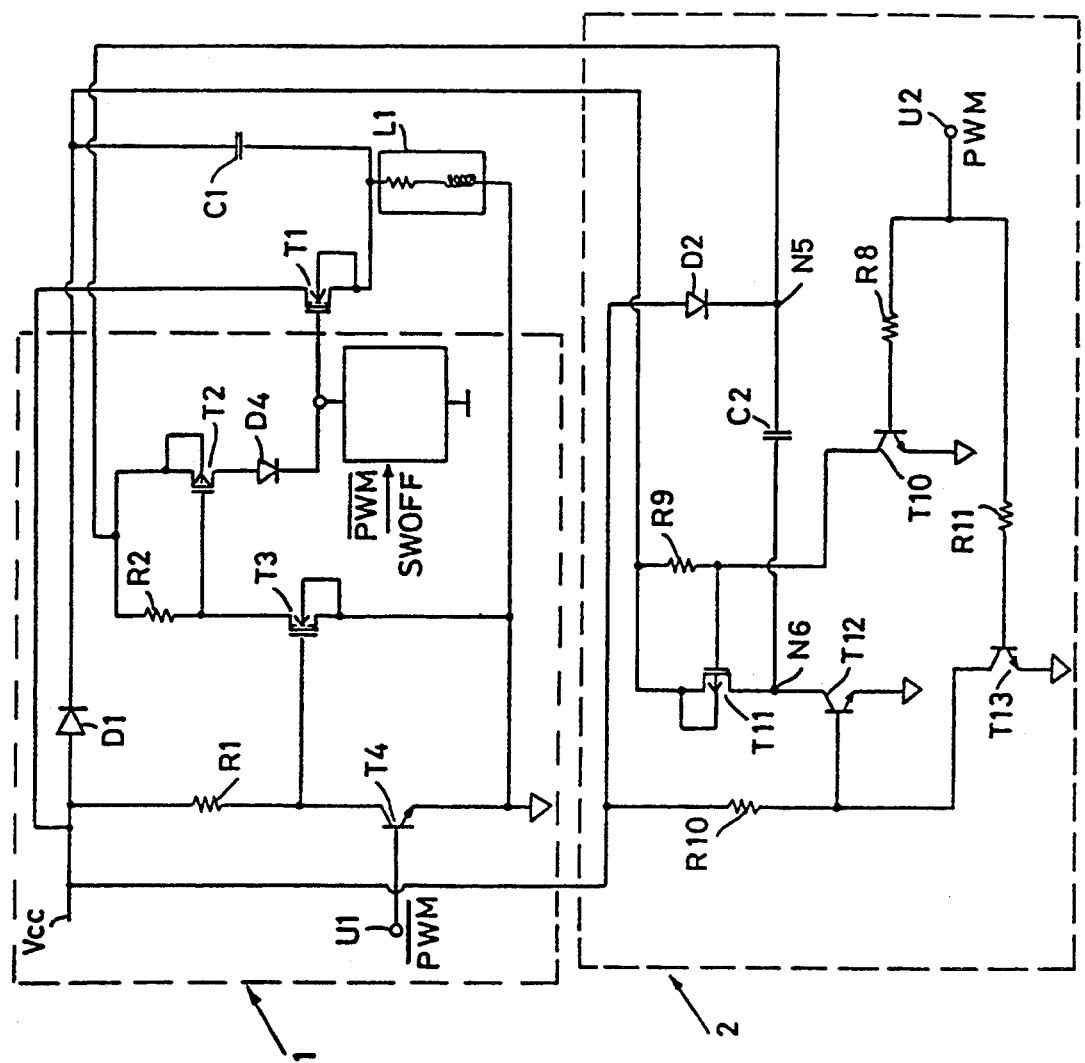
FIG. 2 shows a second embodiment of the circuit according to the invention.

A second embodiment of the bootstrap circuit is illustrated in FIG. 2. The circuit differs from that shown in FIG. 1 insofar as the implementation of block 2 and the absence of diode D3 are concerned. Block 2 includes an NPN bipolar transistor T10 with the base connected through a resistor RS to the PWM signal input U2. The emitter of transistor T10 is connected to ground, and the collector is connected to the gate of a P-channel MOS transistor T11. The collector of transistor T10 is also connected to a resistor R9, which is in turn connected to the source of transistor T11 and to the supply voltage Vcc.

The drain of transistor T11 is connected to a circuit node N6 at one end of the capacitor C2. The other end of capacitor C2 is connected at a circuit node N5 to a diode D2 which, at the other end, is connected to the supply Vcc. Node M6 is also connected to the collector of an NPN bipolar transistor T12. The emitter of transistor T12 is grounded, and the base is connected through resistor R10 to the supply Vcc. The base of transistor T12 is also connected to the collector of NPN bipolar transistor T13. The emitter of transistor T13 is grounded, and the base is connected through a resistor R11 to the PWM signal input U2.

In operation, the circuit of FIG. 2 works as follows. As previously described with reference to the operation of the circuit shown in FIG. 1, the MOS transistor T1 is turned off when the PWM signal present at the input U2 of block 2 is low. In this case, the transistors T10 and T13 are turned off because their bases are low. Transistor T12 is turned on because its base is connected to the supply through resistor R10.

The capacitor C2 charges up to the value:

$$Vccp - Vbe(D2) - Vcesat(T12)$$

The capacitor C1 charges up to the value:

$$Vcc - Vbe(D1)$$

When the PWM signal at the input U2 of block 2 goes high, transistors T10 and T13 are turned on. Transistor T12, whose base is brought low because it is connected to the collector of transistor T13, turns off. P-channel MOS transistor T11, driven at its rate by the collector of transistor T10, turns on.

In this manner, the two capacitors C1 and C2 are connected in series through T11, and together charge up to the voltage:

$$2Vcc - Vbe(D1) - Vbe(D2) - Vcesat(T12)$$

In this case, the conventional bootstrap circuit represented by block 1 connects the two capacitors C1 and C2 in series to the gate of power MOS transistor T1 turning it on at a voltage:

$$Vgson = ((2Vcc - Vbe(D1) - Vbe(D2) - Vcesat(T12)) - Vbe(D4))$$

Unlike the circuit of the first embodiment, in this circuit capacitor C2 is charged in opposite phase with the switching on of the power MOS transistor T1.

Figure 5:
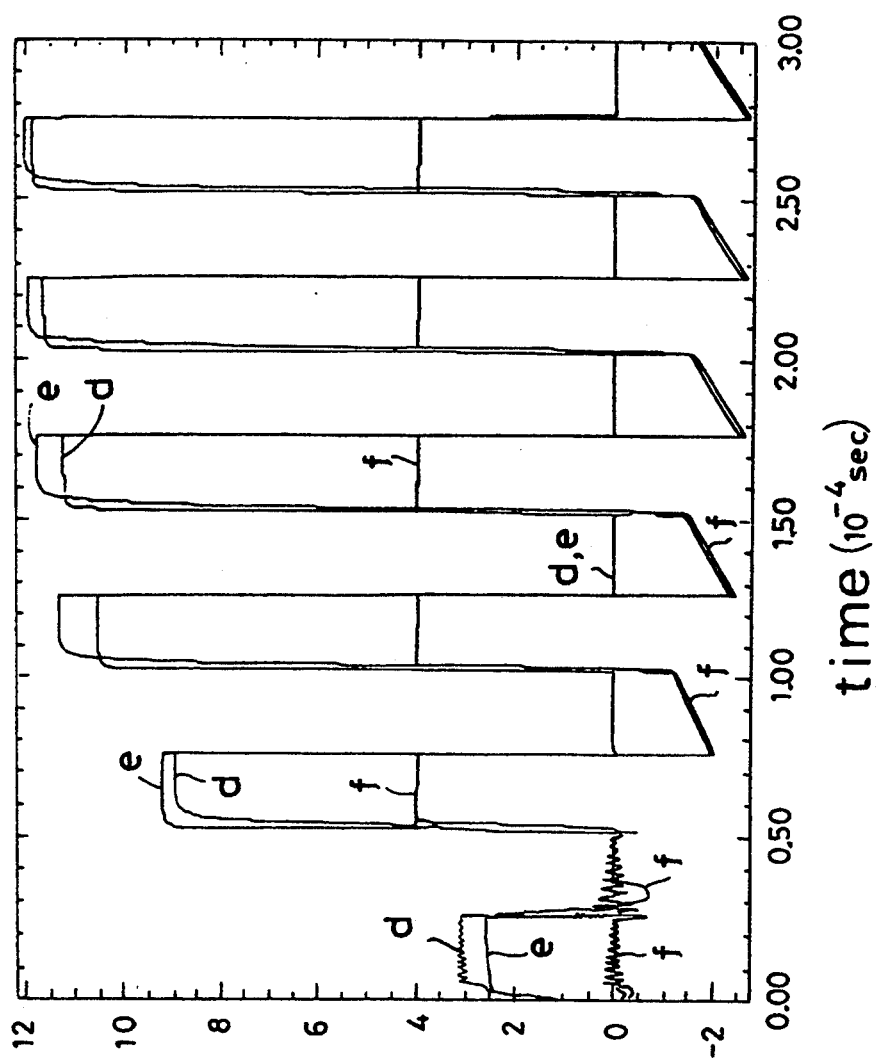
FIG. 5 shows a comparison between the signal patterns on the gate and source of the power MOS transistor in the circuits of FIGS. 1 and 2.

FIG. 5 illustrates voltages as a function of time at different locations within the bootstrap circuits of the first and second embodiments. Curve d represents the gate voltage of power transistor T1 of the first embodiment, and curve e represents the gate voltage of power transistor T1 in the second embodiment. Curve f represents the voltage at the source of power transistor T1, which is the same for both embodiments. FIG. 5 illustrates that there is an increment of the gate voltage obtained by using the bootstrap circuit of the second embodiment. Thus, a slightly higher gate voltage is provided by the series connection of capacitors C1 and C2.

In general, the bootstrap circuit of both embodiments improves the efficiency of a conventional bootstrap circuit for driving a power MOS transistor in a high side driver configuration. This allows operation of the device, which includes the bootstrap circuit and the power MOS transistor, at supply voltages less than about 7 volts. This is true when the power MOS transistor is to operate at high frequencies, such as when used in a switching phase.

Block 2 can also be realized, entirely or partially, using MOS devices. Both of the circuits shown in FIGS. 1 and 2 can be totally integrated in bipolar, MOS, mixed (bipolar, CMOS, DMOS) technology, or can be realized using discrete components.

While the invention has been particularly shown and described with reference to a preferred embodiment, it will be understood by those skilled in the art that various changes in form and detail may be made therein without departing from the spirit and scope of the invention.

What is claimed is:

1. Bootstrap circuit for a power MOS transistor having a drain connected to a power supply terminal and a source connected to a load, comprising a first capacitor chargeable to a first voltage which is a function of the supply voltage of the power transistor, wherein said first capacitor has a first terminal connected to the load and a second terminal connected to said power supply through a first diode and to the gate of the power MOS transistor through first switching means controlled by an activating signal, and including a second capacitor having a first terminal connected to the second terminal of the first capacitor through a second diode and a second terminal connected to ground through second switching means, and further including means, connected to said second terminal of said second capacitor and said second switching means for generating a second voltage on said second capacitor which is higher than said first voltage by an amount at least as great as a threshold voltage of the power MOS transistor.

2. Bootstrap circuit for a power MOS transistor having a drain connected to a power supply terminal and a source connected to a load, comprising a first capacitor chargeable to a first voltage which is a function of the power supply voltage of the power transistor, wherein said first capacitor has a first terminal connected to the load and a second terminal connected to said power supply through a diode, and including a second capacitor having a first terminal connected to the second terminal of said first capacitor through a transistor and a second terminal connected to a gate of said power MOS transistor through a switching means controlled by an activating signal, and further including means coupled to said transistor for generating a second voltage, taken across said capacitors and equal to the sum of the voltages across said first and second capacitors, which is higher than said first voltage plus a threshold voltage of the power MOS transistor.

3. A driver circuit for a MOS power transistor having a drain connected to a power supply terminal, comprising:
   control means connected to a gate of the power transistor for switching the power transistor on and off in response to a control signal;
   a first capacitor having a first end connected to a source of the power transistor and to a load, and having a second end connected to coupled to said power supply through a first diode and to the gate of the power MOS transistor through said control means, said control means for supplying charge to the power transistor gate;
   a second capacitor having a first end connected to the second end of said first capacitor; and
   charging means connected to a second end of said second capacitor for charging said second capacitor when the power transistor is on, and for boosting a voltage on the first end thereof above a supply voltage when the power transistor is off so as to also boost the voltage across said first capacitor, wherein such boosted voltage is applied to the power transistor gate through said control means to turn the power transistor on.

4. The driver circuit of claim 3, further comprising a second diode between the first capacitor second end and the second capacitor first end to prevent current flow from said first capacitor to said second capacitor.

5. The driver circuit of claim 3, wherein said charging means comprises:
   a first switch responsive to the control signal for connecting the second capacitor second end to a ground when the power transistor is on; and
   a second switch responsive to the control signal for connecting the second capacitor second end to said power supply voltage when the power transistor is off.

6. A driver circuit for a MOS power transistor having a source terminal connected to a load and a drain terminal connected to a power supply to a load, comprising:
   control means connected to a gate of the power transistor for switching the power transistor on and off in response to a control signal;
   a first capacitor having a first end connected to a source of the power transistor and to a load;
   a second capacitor having a first end connected to said control means for supplying charge to a gate of the power transistor;
   charging means connected to said power supply and a second end of said first capacitor and to a second end of said second capacitor for charging said second capacitor when the power transistor is off, and for connecting both capacitors in series when the power transistor is on so as to apply a boosted voltage to the power transistor gate through said control means.

7. The driver circuit of claim 6, wherein said charging means comprises:
   first switch means responsive to the control signal for connecting the second capacitor second end to ground when the power transistor is off, wherein said power supply voltage charges said second capacitor; and
   second switch means responsive to the control signal for connecting both second capacitor ends together when the power transistor is on, wherein a boosted voltage is provided to the power transistor gate through said control means.

* * * * *